United States Patent
Olsson et al.

(10) Patent No.: US 7,754,131 B2
(45) Date of Patent: Jul. 13, 2010

(54) DEVICE FOR TRANSFERRING A PATTERN TO AN OBJECT

(75) Inventors: Lennart Olsson, Malmo (SE); Peter Andersson, Stockholm (SE)

(73) Assignee: Obducat AB, Malmo (SE)

( * ) Notice: Subject to any disclaimer, the term of this patent is extended or adjusted under 35 U.S.C. 154(b) by 1335 days.

(21) Appl. No.: 10/525,034

(22) PCT Filed: Jul. 31, 2003

(86) PCT No.: PCT/SE03/01245

§ 371 (c)(1),
(2), (4) Date: Feb. 17, 2005

(87) PCT Pub. No.: WO2004/021083

PCT Pub. Date: Mar. 11, 2004

(65) Prior Publication Data

US 2006/0006580 A1 Jan. 12, 2006

Related U.S. Application Data

(60) Provisional application No. 60/406,052, filed on Aug. 27, 2002.

(30) Foreign Application Priority Data

Aug. 27, 2002 (SE) .................................... 0202550

(51) Int. Cl.
*B28B 11/08* (2006.01)

(52) U.S. Cl. ........................ 264/293; 264/106; 264/107; 264/39; 425/155; 425/193; 425/385

(58) Field of Classification Search ............... 216/44; 72/352; 264/401, 293, 106, 107, 39; 425/155, 425/193, 385

See application file for complete search history.

(56) References Cited

U.S. PATENT DOCUMENTS

| | | | | |
|---|---|---|---|---|
| 3,502,761 | A | * | 3/1970 | Dimitracopoulos ......... 264/153 |
| 3,704,974 | A | * | 12/1972 | Kostur ........................ 425/214 |
| 4,079,232 | A | * | 3/1978 | Brokoff et al. .............. 219/154 |
| 4,377,377 | A | * | 3/1983 | Arends et al. ............... 425/155 |

(Continued)

FOREIGN PATENT DOCUMENTS

JP 58131732 A 8/1983

(Continued)

*Primary Examiner*—Joseph S Del Sole
*Assistant Examiner*—David N Brown, II
(74) *Attorney, Agent, or Firm*—Renner, Otto, Boiselle & Sklar, LLP

(57) ABSTRACT

A device (4) for transferring a pattern to an object (2). The invention relates especially to production of micro and nano-structures. The device comprises an alignment means (10) arranged in connection with a first contacting means (7) for controlling the motion of the first stamp (8) in a direction perpendicular to the pressing direction (A), and a second contacting means (11) having a second stamp (12) adapted to imprint a second pattern in the second surface (6) of the object (2), and a pressing means (9) further adapted to press the second stamp (12) into contact with the second surface (6) of the object (2) in the pressing direction (A). Hereby is obtained a device of a simple design, which has a high accuracy of the alignment of the stamps in relation to the object.

14 Claims, 4 Drawing Sheets

U.S. PATENT DOCUMENTS

| | | | |
|---|---|---|---|
| 4,450,201 A * | 5/1984 | Brill et al. | 428/336 |
| 4,450,553 A * | 5/1984 | Holster et al. | 369/275.5 |
| 4,633,458 A * | 12/1986 | Tiefensee | 369/275.5 |
| 5,061,164 A * | 10/1991 | Sabado et al. | 425/116 |
| 5,108,672 A * | 4/1992 | Sasaki et al. | 264/40.5 |
| 5,512,131 A * | 4/1996 | Kumar et al. | 438/738 |
| 5,617,785 A * | 4/1997 | Lo | 101/3.1 |
| 5,726,542 A * | 3/1998 | Ebihara | 318/35 |
| 5,772,905 A * | 6/1998 | Chou | 216/44 |
| 5,817,242 A * | 10/1998 | Biebuyck et al. | 216/41 |
| 5,993,189 A * | 11/1999 | Mueller et al. | 425/405.1 |
| 6,060,121 A * | 5/2000 | Hidber et al. | 427/261 |
| 6,210,609 B1 * | 4/2001 | Takeda et al. | 264/1.33 |
| 6,280,811 B1 * | 8/2001 | Nee | 428/64.1 |
| 6,314,873 B1 * | 11/2001 | Lee et al. | 100/35 |
| 6,325,609 B1 * | 12/2001 | Shimada | 425/140 |
| 6,466,301 B1 | 10/2002 | Yui et al. | |
| 6,514,123 B1 * | 2/2003 | Crevasse et al. | 451/28 |
| 6,758,664 B1 * | 7/2004 | Curtiss et al. | 425/193 |
| 6,766,999 B2 * | 7/2004 | Hosoe | 249/135 |
| 6,787,072 B2 * | 9/2004 | Border et al. | 264/2.5 |
| 2001/0029714 A1 * | 10/2001 | Lynch et al. | 52/309.13 |
| 2001/0050449 A1 * | 12/2001 | Baxter | 264/402 |
| 2002/0098426 A1 | 7/2002 | Sreenivasan et al. | |
| 2002/0125616 A1 * | 9/2002 | Minami et al. | 264/511 |
| 2003/0219992 A1 * | 11/2003 | Schaper | 438/748 |

FOREIGN PATENT DOCUMENTS

| | | |
|---|---|---|
| JP | 62196826 | 8/1987 |
| JP | 62-211657 | 9/1987 |
| JP | 01307758 | 12/1989 |
| JP | 06230581 A | 8/1994 |
| JP | 09244265 | 9/1997 |
| JP | 2000155430 A | 6/2000 |
| WO | WO 01/42858 A1 | 6/2001 |

\* cited by examiner

DEVICE FOR TRANSFERRING A PATTERN TO AN OBJECT

CROSS REFERENCE TO RELATED APPLICATIONS

This application is an national phase application based on PCT/SE2003/001245, filed Jul. 31, 2003, which claims the benefit of U.S. Provisional Application No. 60/406,052, filed Aug. 27, 2002, and claims the right to priority based on Swedish Application No. 0202550-0, filed Aug. 27, 2002 the content of each of which is incorporated herein by reference in its entirety.

FIELD OF THE INVENTION

The present invention relates generally to transferring a pattern from a stamp to an object. The invention relates especially to production of micro- and nanostructures.

BACKGROUND ART

A promising technique of producing nanostructures, i.e. structures in the order of 100 nm and smaller, is so-called nanoimprint lithography, however this technique may also be used to microstructures. This technique is described in the document U.S. Pat. No. 5,772,905, which is incorporated herewith by reference. In such lithography, the main steps of which are schematically shown in FIGS. 1a-d, a pattern of nanostructures is transferred from a stamp 1 to an object 2. The object 2 consists of a substrate 2a and, applied thereto, a film 2b of a polymer material (resist). After heating of the film 2b to a suitable temperature, the stamp 1 is pressed into the same (FIG. 1b). The stamp 1 is then released from the object 2 when recesses 3 of a desired depth have been formed in the layer 2b (FIG. 1c). Subsequently any remaining film in the recesses 3 is removed, for instance by etching, thereby exposing the substrate or in some other material which is applied to the substrate.

A device according to the above mentioned US patent for carrying out the above lithographic process comprises a first contacting means with receiving surface for the stamp, a second contacting means for contacting or joining the first and second receiving surfaces with each other.

The film applied to the substrate is very thin, typically 50-200 nm. For even structuring of the object, the stamp and the object must thus be mutually parallel with an accuracy of a few nanometres.

Especially due to the fact that the high requirements in accuracy, when manufacturing micro and nanostructures, in the alignment between the stamp and the object, there is a great need for exact control of the movement of the stamp in the direction perpendicular to the pressing direction, as a small displacement of the stamp can have the severe consequence that the pattern transferred to the object cannot be used.

The substrate is usually made of a brittle material, e.g. Si/SiO$_2$, GaAs or InP, and the pressure exerted upon the substrate during contact is high, typically 4-10 MPa.

In the case where a pattern is to be transferred to both surfaces of the object in a single process, there is established a need for a still more reliable controlling of the stamp in the direction perpendicular to the pressing direction. Particularly in this instance it is important that the transferring of the patterns has a high accuracy as the matter could be that the object is totally destroyed and thereby not usable.

Furthermore to obtain that the pattern is transferred to the object in expedient manner, the object is heated to a temperature approximately between 150 and 300° C. This high temperature of the object during pressing causes that heat is transferred from the object to the surroundings, i.e. the stamp as well as the contacting means. During this heat transmission an uneven temperature distribution (also during subsequent cooling of the object) in the known devices is obtained, whereby changes in the shapes and sizes of the contacting means as well as stamps occur and thereby displacements of the elements in the devices may arise. This will have a severe consequence for the final product, due to the fact that only a minimal displacement of the pattern in relation to the intended placement will render the product useless.

SUMMARY OF THE INVENTION

An object of the present invention is to wholly or partly overcome the above disadvantages of the prior art. More specifically, it is an object to provide a device for transferring a pattern to an object, said device having a high accuracy of the stamps during the pressing.

It is also an object of the present invention to provide a device which is not influenced by the deviating temperatures of the object.

It is furthermore an object of the invention to provide a device which is simple in construction and which in expedient manner may be used to transfer patterns to both surfaces on the object at the same time.

It is a specific object of the invention to provide a device which is suited for transferring micro- or nanostructures to the object.

The above objects, together with numerous other objects, advantages and features which will become evident from the below description, are accomplished by a solution in accordance to the present invention by a device for transferring a pattern to an object, said object having a first surface and a second surface, said device comprising a first contacting means having a first stamp adapted to imprint a first pattern in the first surface of the object, and a pressing means adapted to press the first stamp into contact with the first surface of the object in a pressing direction. Furthermore, an alignment means is arranged in connection with the first contacting means for controlling the motion of the first stamp in a direction perpendicular to the pressing direction, and a second contacting means having a second stamp is adapted to imprint a second pattern in the second surface of the object, and the pressing means is further adapted to press the second stamp into contact with the second surface of the object in the pressing direction.

Hereby is obtained a device of a simple design, which has a high accuracy of the alignment of the stamps in relation to the object, thus during operation of the device the displacement, which occurs in the prior art, is limited to an almost imperceptible level inside the limits of accuracy, which is necessary when the pattern is transferred at the same time to both the first surface and the second surface of the object.

During operation of the device according to the present invention the pressing means is pressing the first stamp into contact with the first surface of the object in a pressing direction. Throughout this movement the alignment means is controlling the motion of the first stamp in a direction perpendicular to the pressing direction, thus securing that the first stamp will come into contact with the first surface of the object exactly as intended. As the pressing means is further pressing in the pressing direction, the second stamp will come into contact with the second surface of the object, whereby the first stamp will imprint the first pattern in the first surface of the object and at the same time the second stamp will imprint the second pattern in the second surface of the object. The device is of a simple design and can thereby be formed to allow contacting of the stamps with the object under high pressure.

According to a preferred embodiment according to the present invention alignment means may be arranged in connection with the second contacting means. A higher accuracy is hereby secured, thus, it is obtained that no mutual displacement between the contacting means during the pressing occurs.

In an expedient embodiment according to the invention the alignment means may be an arm, which protrude from at least the first contacting means to a rail adapted to a stationery support and wherein the arm is arranged to slide in the pressing direction on the rail. Hereby is obtained a simple construction of the device with a high alignment accuracy. Furthermore the alignment means may be incorporated in existing devices without construction-wise alterations.

Advantageously according to the invention the size of the contacting means may be substantially identical. Hereby is obtained that the heat transfer capability for the two contacting means is essentially the same, whereby the heat transferred to them does not influence their mutual alignment. The matter is that the thermal displacement which may occur is substantially the same for both contacting means.

Further according to the invention heating means be may arranged for heating the object to a predetermined temperature. The temperature of the object may be heated to 500° C., preferably between 250 and 350° C., most preferably between 280 and 320° C. The above mentioned temperature intervals depend upon the material of the substrate which will be appreciated by the skilled person.

According to the invention a temperature sensor may be adapted to monitor the temperature of the object during the stamping.

A pressure sensor may be arranged according to the invention in connection with the pressing means. Furthermore, a control unit may be adapted, based on the pressure detected by the pressure sensor, to cause the pressing means to establish a given pressure between the stamps and the object.

The stamp may in a preferred expedient embodiment according to the present invention have a pattern of micro- or nanostructures.

The object may preferably comprise a substrate and a layer of a polymer material applied thereto.

In a preferred embodiment according to the invention the pressing means may be arranged as mechanically operating means, such as a jack or a screw. Hereby is obtained that the inaccuracy in alignment, which often arises in hydraulic presses, is minimised.

In an expedient embodiment according to the invention a heat transmission barrier may be arranged between the contacting means and the pressing means to minimize the heat transfer here between. Hereby is obtained that no uneven heat transfer throughout the device occurs and thereby inaccuracy in the alignment as a consequence.

BRIEF DESCRIPTION OF THE DRAWINGS

The invention and its advantages will be described in more detail below with reference to the accompanying schematic drawings, which by way of example illustrate currently preferred embodiments of the invention.

All the figures are highly schematic and not necessarily to scale, and they show only parts which are necessary in order to elucidate the invention, other parts being omitted or merely suggested.

DESCRIPTION OF PREFERRED EMBODIMENTS

Figure 1A:
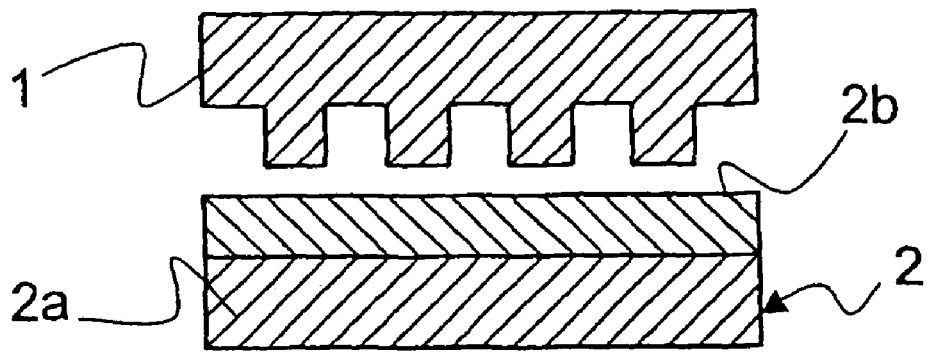
FIGS. 1a-1d illustrate transfer of a pattern from a stamp to a substrate by nanoimprint lithography according to a known process.
Figure 1B:
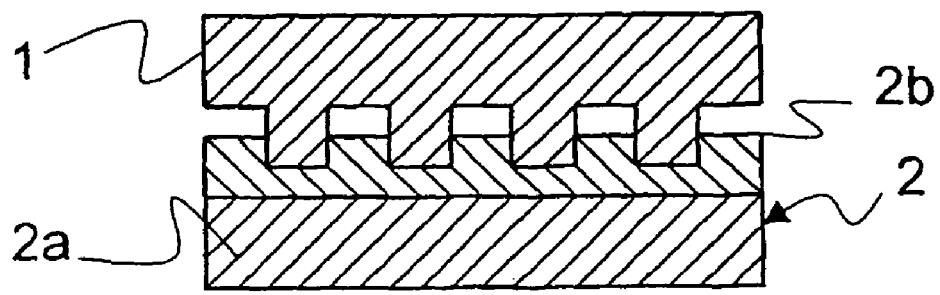
Figure 1C:
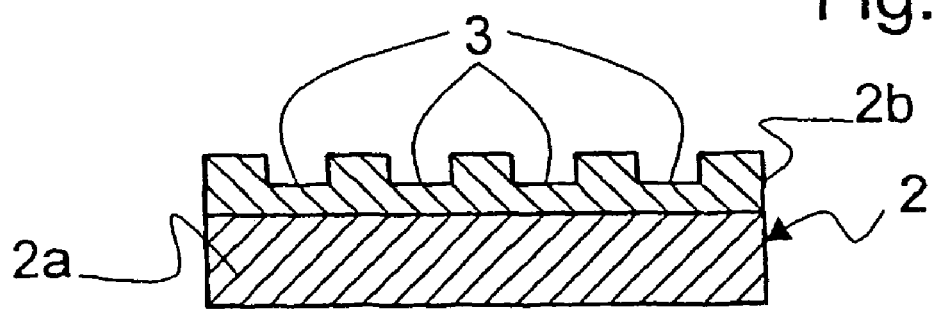
Figure 1D:
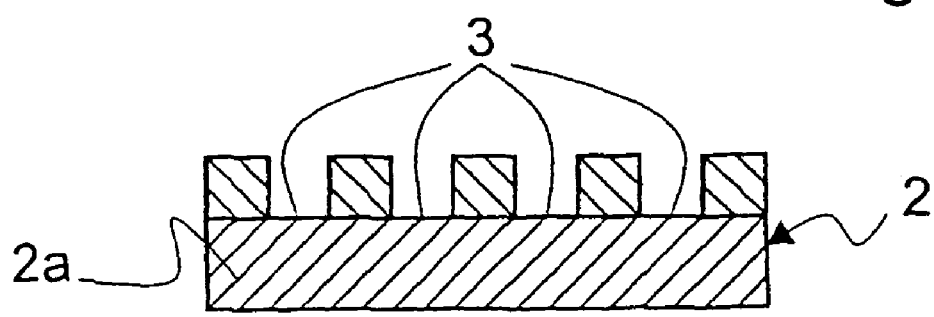
Figure 2:
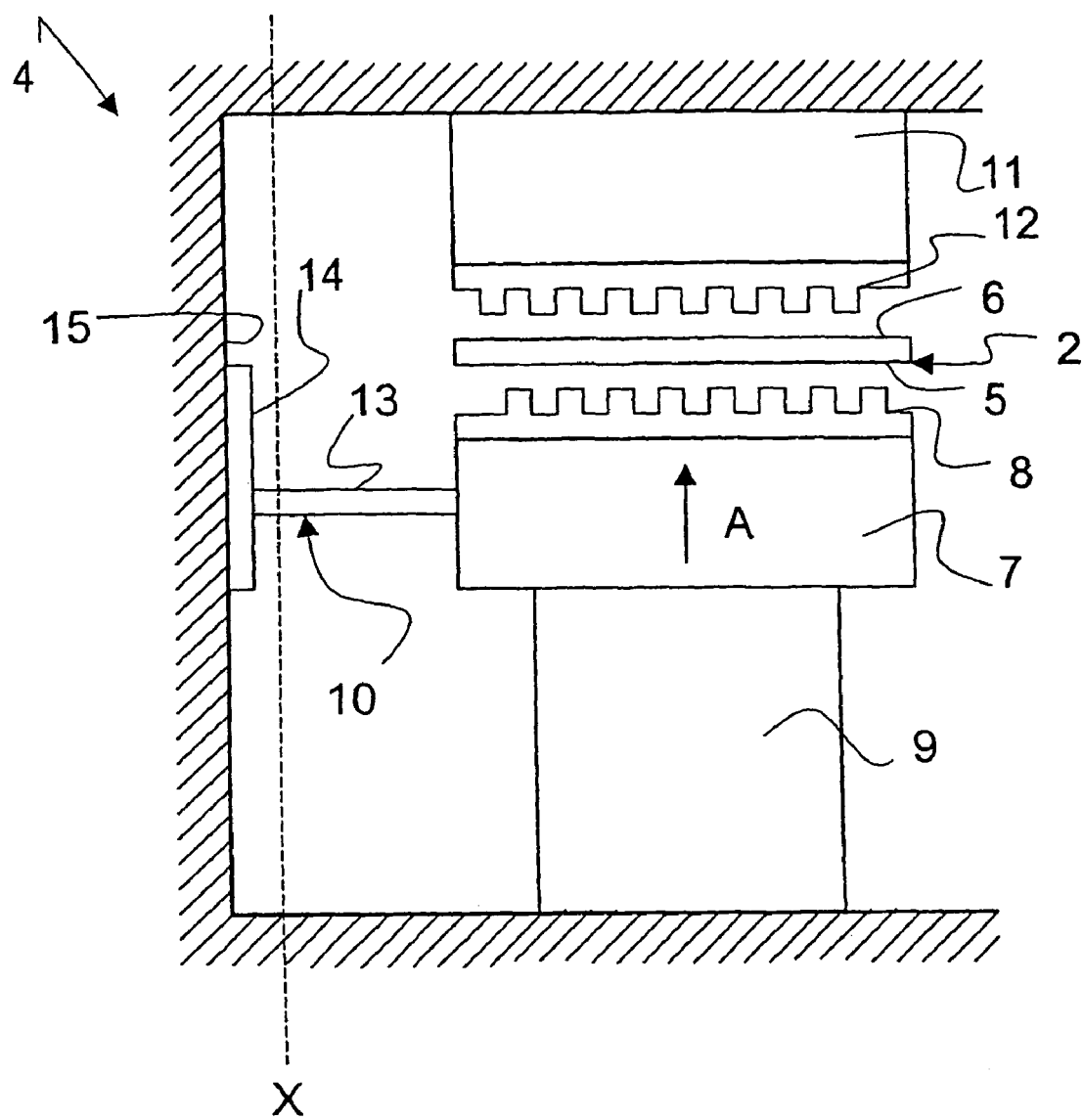
FIG. 2 is a schematic view of a device according to a first embodiment of the invention.

FIG. 2 is a schematic view of a device according to a first embodiment of the invention. The device 4 for transferring a pattern to the object 2, said object 2 having a first surface 5 and a second surface 6, said device 4 comprising a first contacting means 7 having a first stamp 8 adapted to imprint a first pattern in the first surface 5 of the object 2.

A pressing means 9 is furthermore adapted to press the first stamp 8 into contact with the first surface 5 of the object 2 in a pressing direction, indicated by arrow A. The pressing direction is in this embodiment shown as a vertical movement of the pressing means 9, however, it may also according to the invention be horizontal or inclined movements, which will be appreciated by the skilled person. The pressing means 9 can be of a prior-art type, such as a hydraulically or pneumatic operated press. However, according to the invention the the pressing means may be arranged as mechanically operating means, such as a jack or a screw, whereby a simple and inexpensive device is obtained, still having a high precision in pressing.

Common for the pressing means are that they shall be able to apply an exact predetermined pressure to be used in the transferring of the patterns to the object. The pressure exerted is typically 4-10 MPa.

The pressing means 9 is in this embodiment shown in connection with the first contacting means 7 only, but may according to the invention also be arranged in connection with the second contacting means 11 as well as in connection with both contacting means.

An alignment means 10 is arranged in connection with the first contacting means 7 for controlling the motion of the first stamp 8 in a direction perpendicular to the pressing direction A. Furthermore there is a second contacting means 11 having a second stamp 12 adapted to imprint a second pattern in the second surface 6 of the object 2, and the pressing means 9 further adapted to press the second stamp 12 into contact with the second surface 6 of the object 2 in the pressing direction A.

In this embodiment the alignment means 10 comprises an arm 13, which protrude from at least the first contacting means 7 to a rail 14 adapted to a stationery support 15 and wherein the arm 13 is arranged to slide in the pressing direction A on the rail 14.

Furthermore it is expedient according to the invention that the arm is provided with a pretension whereby it is obtained that there is no displacement between the rails and the contacting means. Preferably the arm and rails may be made of metal, such as for instance stainless steel.

Figure 3:
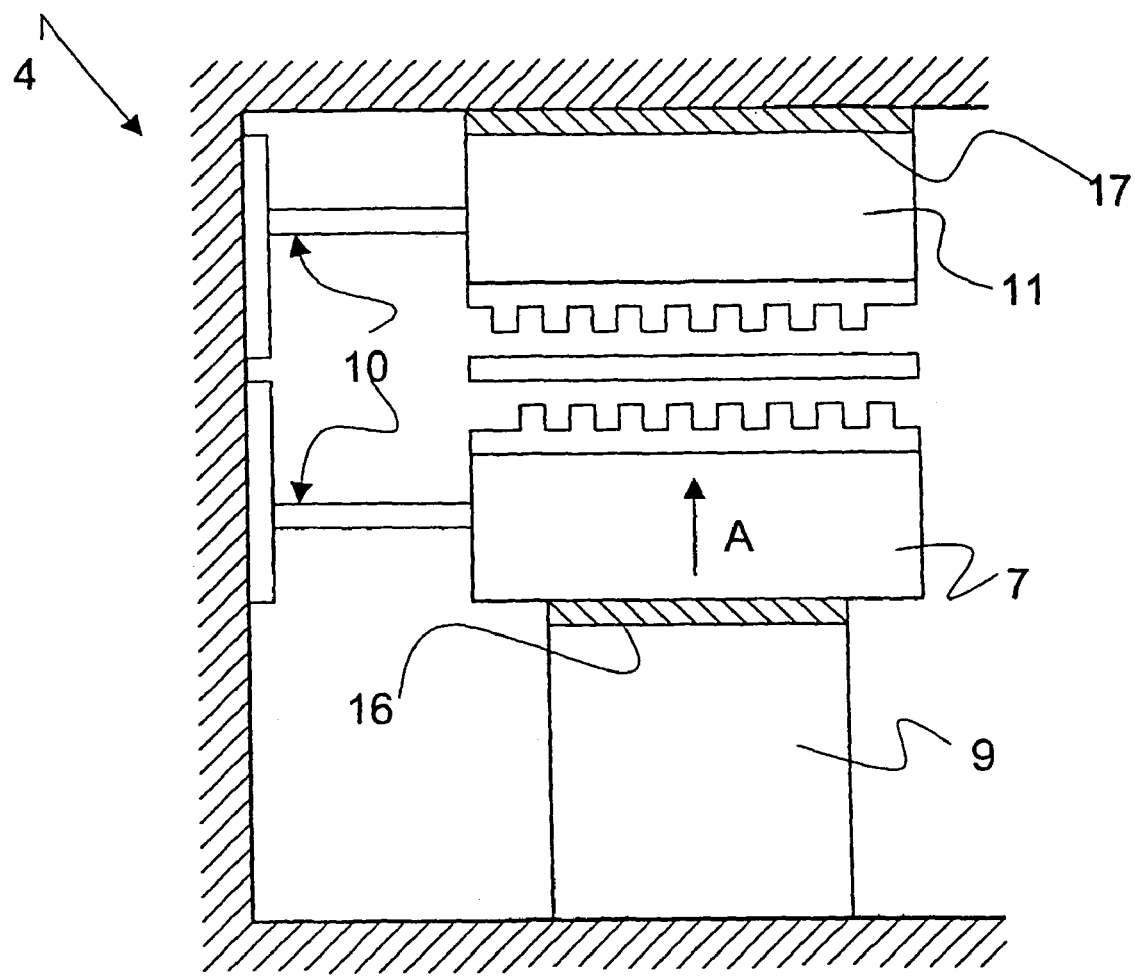
FIG. 3 is a schematic view of a device according to a second embodiment of the invention.

FIG. 3 is a schematic view of a device 4 according to a second embodiment of the invention. In this device 4 alignment means 10 is also arranged in connection with the second contacting means 11. In this embodiment the size of the contacting means 7 and 11 is furthermore substantially identical.

The device may also according to the invention comprise heating means (not shown) arranged for heating the object to a predetermined temperature. The temperature of the object may be heated to 500° C., preferably between 250 and 350° C., most preferably between 280 and 320° C.

Further a temperature sensor (not shown) may be adapted to monitor the temperature of the object 2 during the pressing.

Especially with these high temperatures applied to the object 2, it is required to control in an exact manner the heat transfer from the object 2 to the surroundings, i.e. the stamps 8 and 12 as well as the contacting means 7 and 11. If the heat transfer is not controlled this could have severe consequences as an uneven temperature stabilisation throughout the device will influence the alignment between the object 2 and the stamps 8 and 12.

Particularly in the embodiment illustrated in FIG. 3 an exact heat transfer is obtained as the contacting means 7 and 11 are substantially identical in size as well as both contacting means 7 and 11 have aligning means 10 arranged in connection with them also having substantially identical sizes.

Furthermore a heat transmission barrier 16 may be arranged between the contacting means 7 and the pressing means 9 to minimize the heat transfer here between. A heat transmission barrier 17 may also be arranged between the contacting means 11 and the stationery support 15.

By the inventive idea the thermal movements of the contacting means are perpendicular to the pressing direction equal with a common line X as shown in FIG. 2.

The device 4 may furthermore comprise cooling means (not shown) for cooling the object during the pressing. Also in this instance it is required to control the heat transfer in an exact manner for obtaining a temperature stabilisation of the contacting means 7 and 11 as well as to prevent changes in their shapes.

Figure 4:
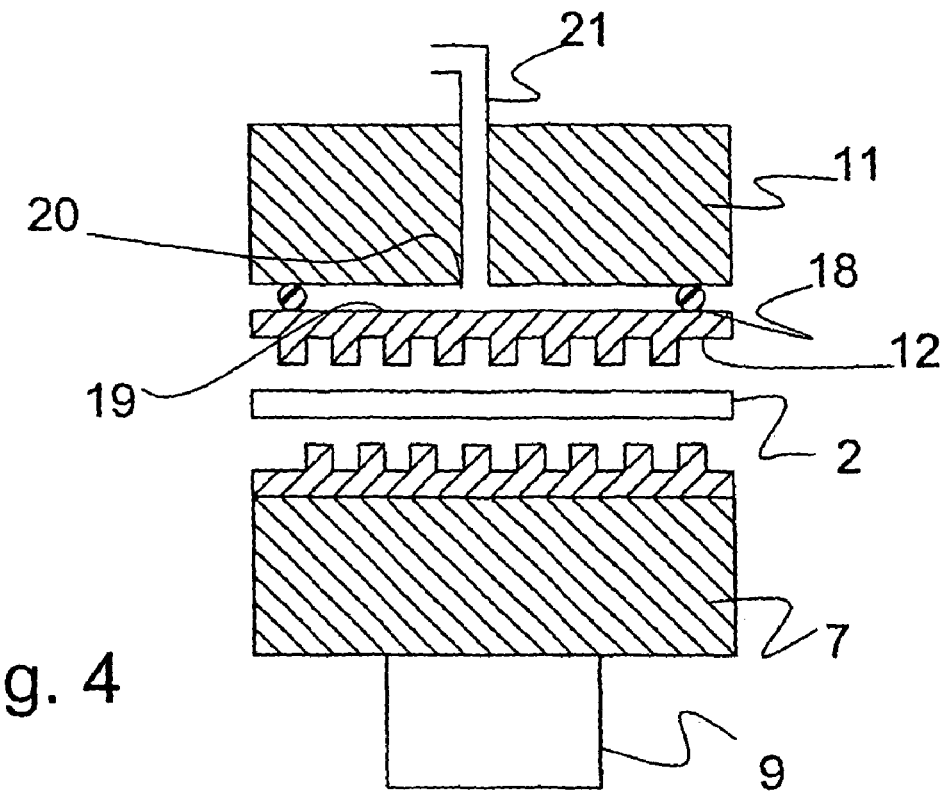
FIG. 4 is a schematic view of a part of a device according to a third embodiment of the invention.
Figure 5:
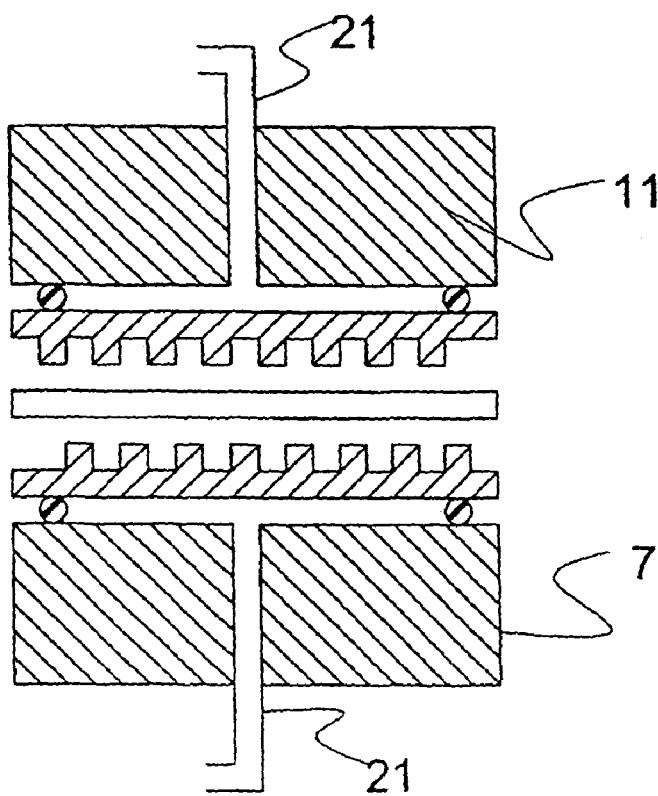
FIG. 5 is a schematic view of a part of a device according to a fourth embodiment of the invention.

In FIG. 4 and FIG. 5 further embodiments according to the invention are shown, wherein the pressing means is partly or fully replaced by the gas imprint technique.

In FIG. 4 there is, in connection with the second contacting means 11, arranged a sealing gasket 18, which essentially extends around the area of the pattern of the second stamp 12. The sealing gasket 18 may be housed in a groove (not shown) in the second contacting means 11 and be attached thereto in any suitable fashion. The sealing gasket may also be arranged in a corresponding groove in the stamp 12. The surface of the contacting means 11, the sealing gasket 18 and the back surface 19 of the stamp 12 together define a cavity 20, which will function as a pressure cavity for providing a pressure on the back surface of the stamp 12.

The pressure in the pressure cavity 20 is controlled via a pressure medium channel 21, which in turn is connected to an appropriate pressure control apparatus (not shown). The pressure medium channel 21 may be provided with a valve (not shown) for controlling the flow in the pressure medium channel. The valve may be adapted for limiting the flow in the pressure medium channel, so as to prevent major outflows of pressure medium in case e.g. the stamp 12 or the object 2 should break.

It is also possible to provide the pressure cavity 20 and/or the pressure medium channel 21 with a pressure sensor (not shown). Such a pressure sensor may provide an accurate measurement of the pressure inside the cavity. The measurement may be used to control the pressure in order to prevent damage to the object and/or the stamp. It is also possible to monitor the pressure in the cavity 20 with a view to cutting of the flow of pressure medium in the pressure medium channel 21 in case of a rapid decline in pressure, such as would be the case when a stamp or an object breaks.

In order to generate a sufficient contact pressure between the sealing gasket, the stamp and the contacting means, a pressure may be added on the contacting means after the stamp and the object have been aligned.

The device is arranged to press the first and second contacting means towards each other and to provide a static gas pressure within said pressure cavity. In the embodiment shown in FIG. 4 the first contacting means is operated by pressing means 9, such as for instance hydraulic or mechanical presses. The static gas pressure may be arranged to assume at least two states. In a first state, the static gas pressure within said pressure cavity is essentially equal to or lower than a gas pressure of a surrounding environment. In a second state, the static gas pressure within the pressure cavity is substantially higher than in the first state. In the first state, an average distance between a back surface of the, stamp 19 and the surface area of the second contacting means 11 may be between 0.01 and 4 millimeters, preferably between 0.3 and 1 millimeters and more preferably between 0.4 and 0.6 millimeters.

By providing a static pressure according to the invention, the pressure on the stamp or object back surface will be uniform, thus ensuring that the stamp and the object are parallel and that there are no local pressure maximums, whereby an expedient imprint of a pattern is obtained.

Using a gas instead of e.g. hydraulic oil, preferably an inert gas, furthermore reduces the risk of contaminating the environment surrounding the device.

In FIG. 5 a part of the device is shown wherein both the first contacting means as well as the second contacting means are operated by the gas imprint technique as explained above in relation to FIG. 4.

According to the invention a pressure sensor (not shown) may in expedient manner be arranged in connection with the pressing means 9. Furthermore a control unit (not shown) may be adapted, based on the pressure detected by the pressure sensor, to cause the pressing means to establish a given pressure between the stamps and the object.

The object 2 may be single- or double-sided circuit boards or single- or double-sided CD-ROMs or DVDs. The object may in expedient manner have a shape corresponding to its subsequent application, for instance round or quadrangular or other geometric shapes as will be appreciated by a skilled person.

Although the invention above has been described in connection with preferred embodiments of the invention, it will be evident for a person skilled in the art that several modifications are conceivable without departing from the invention as defined by the following claims.

The invention claimed is:

1. A device for transferring a pattern of micro- and nanostructures to an object, said object having a first surface and a second surface, said device comprising a first contacting means having a first stamp adapted to imprint a first pattern in the first surface of the object, and a pressing means adapted to press the first stamp into contact with the first surface of the object in a pressing direction, an alignment means arranged in connection with the first contacting means for controlling the motion of the first stamp in a direction perpendicular to the pressing direction, and a second contacting means having a second stamp adapted to imprint a second pattern in the second surface of the object, and the pressing means further adapted to press the second stamp into contact with the second surface of the object parallel to the pressing direction, wherein a heat transmission barrier is arranged between the first contacting means and the pressing means to minimize heat transfer therebetween, wherein the alignment means comprises an arm, which protrudes from at least the first contacting means to a rail in the pressing direction adapted to a stationery support, and wherein the arm is arranged to slide in the pressing direction on the rail.

2. A device according to claim 1, wherein the alignment means is arranged in connection with the second contacting means.

3. A device according to claim 1, wherein the size of the first contacting means and second contacting means is substantially identical.

4. A device according to claim 1, wherein a heating means is arranged for heating the object to a predetermined temperature.

5. A device according to claim 4, wherein the heating means is devised to heat the object receiving the pattern to a temperature of up to 500° C.

6. A device according to claim 4, wherein a temperature sensor is adapted to monitor the temperature of the object during the pressing.

7. A device according to claim 1, wherein a pressure sensor is arranged in connection with the pressing means.

8. A device according to claim 7, wherein a control unit is adapted, based on the pressure detected by the pressure sensor, to cause the pressing means to establish a given pressure between the stamps and the object.

9. A device according to claim 1, wherein the first stamp and the second stamp have patterns of micro—or nanostructures.

10. A device according to claim 1, wherein the pressing means is arranged as mechanically operating means.

11. A device according to claim 1, wherein the first contacting means and second contacting means are made of metal.

12. Method for transferring a pattern of micro- and nanostructures to an object, said object having a first surface and a second surface opposite to the first surface using a device comprising a first contacting means having a first stamp adapted to imprint a first pattern in the first surface of the object, and a pressing means adapted to press the first stamp into contact with the first surface of the object in a pressing direction, comprising the steps of:

disposing the object between the first stamp having a first pattern facing the first surface, and the second stamp having a second pattern facing the second surface;

pressing the first stamp in a pressing direction towards the object for imprinting the first pattern in the first surface, and pressing the second stamp and the object towards each other for imprinting the second pattern in the second surface; and controlling the motion of the first stamp in a direction perpendicular to the pressing direction by:

connecting the first contacting means carrying the first stamp with an arm, which protrudes from at least the first contacting means, to a rail in the pressing direction adapted to a stationery support;

minimizing heat transfer between the first contacting means and the pressing means by placing a heat transmission barrier there between, and sliding the contacting means along the rail in the pressing direction.

13. A device according to claim 4, wherein the heating means is devised to heat the object receiving the pattern to a temperature 250 and 350° C.

14. A device according to claim 4, wherein the heating means is devised to heat the object receiving the pattern to a temperature between 280 and 320° C.

* * * * *